(12) United States Patent
Wang et al.

(10) Patent No.: US 8,120,727 B2
(45) Date of Patent: Feb. 21, 2012

(54) ARRAY SUBSTRATE OF TFT-LCD AND A METHOD FOR MANUFACTURING THE SAME

(75) Inventors: Gang Wang, Beijing (CN); Zenghui Sun, Beijing (CN); Chuanzhen Liu, Beijing (CN); Xibin Shao, Beijing (CN); Hongyu Liu, Beijing (CN); Ke Wang, Beijing (CN)

(73) Assignee: Boe Technology Group Co., Ltd., Beijing (CN)

( * ) Notice: Subject to any disclaimer, the term of this patent is extended or adjusted under 35 U.S.C. 154(b) by 351 days.

(21) Appl. No.: 12/466,745

(22) Filed: May 15, 2009

(65) Prior Publication Data
US 2009/0283768 A1    Nov. 19, 2009

(30) Foreign Application Priority Data
May 16, 2008    (CN) .......................... 2008 1 0111874

(51) Int. Cl.
  *G02F 1/1335*    (2006.01)
  *G02B 5/30*    (2006.01)
  *G02B 27/28*    (2006.01)
(52) U.S. Cl. ..................................... 349/96; 359/487.03
(58) Field of Classification Search ............... 359/487.03
  See application file for complete search history.

(56) References Cited

U.S. PATENT DOCUMENTS

| | | | | |
|---|---|---|---|---|
| 7,480,017 | B2* | 1/2009 | Fisher et al. | 349/96 |
| 7,951,527 | B2* | 5/2011 | Choo et al. | 430/321 |
| 2006/0061519 | A1* | 3/2006 | Fisher et al. | 345/32 |
| 2007/0076143 | A1* | 4/2007 | Palk et al. | 349/96 |
| 2008/0100779 | A1* | 5/2008 | Choo et al. | 349/96 |
| 2009/0290105 | A1* | 11/2009 | Takada | 349/96 |

* cited by examiner

*Primary Examiner* — Rhonda Peace
(74) *Attorney, Agent, or Firm* — Ladas & Parry LLP

(57) ABSTRACT

The present invention relates to an array substrate of TFT-LCD and Method for manufacturing the same. The array substrate includes: gate lines, data lines, pixel electrodes and TFTs formed on a substrate; and a grid graph formed on each of the pixel electrode to make each of the pixel electrodes be simultaneously a built-in polarizer and change natural lights into linear polarized lights. The method for manufacturing an array substrate includes: forming a graph including gate electrodes and gate lines on a substrate; depositing continuously a gate insulating layer, a semiconductor layer and a doped semiconductor layer, and forming graphs of semiconductor layers and doped semiconductor layers above the gate electrodes; forming graphs of source electrodes, drain electrodes, data lines and pixel electrodes, in which a grid graph formed on each of the pixel electrode to make each of the pixel electrodes be simultaneously a built-in polarizer and change natural lights into linear polarized lights. In the present invention, there is no need to attach polarizer of absorption type to the array substrate after being disposed with the color filter substrate as a cell, thereby reducing the production cost of the TFT-LCD, and which is propitious to reduce the thickness of the TFT-LCD and increase the power utilization efficiency greatly of LCD.

13 Claims, 11 Drawing Sheets

ARRAY SUBSTRATE OF TFT-LCD AND A METHOD FOR MANUFACTURING THE SAME

CROSS-REFERENCE TO RELATED APPLICATIONS

This application claims priority to Chinese Patent Application No. 200810111874.9, filed on May 16, 2008, entitled "An Array Substrate of TFT-LCD and a Method for Manufacturing the same", which is hereby incorporated by reference in its entirety.

FIELD OF THE TECHNOLOGY

The present invention relates to a thin film transistor-liquid crystal display (TFT-LCD) and a method for manufacturing the same, and particularly to an array substrate of TFT-LCD and a method for manufacturing the same.

BACKGROUND

Along with the rapid development of flat-panel display technologies, the flat-panel display apparatus has gradually replaced the conventional cathode ray tube (CRT) display and fleetly entered people's life due to its advantages, such as low power consumption and light-thin. TFT-LCD has been accepted by most customers due to its performances, such as long life, low power consumption and nonradiation, and applied into people's life and production widely. However, LCD with lower production cost and lower power consumption, and being lighter and thinner is always a purpose sought by people.

The main structure of TFT-LCD includes an array substrate and a color filter substrate disposed together and face to face as a cell. There are pieces of polarizers attached to the outer surfaces of the array substrate and the color filter substrate. In practical implementation, it is indicated that the TFT-LCD in the prior art has the following technical disadvantages:

(1) Since all of the polarizers applied in the prior art change natural lights into linear polarized lights by absorbing unwanted light, more than 50% lights are wasted during being polarized, which makes the power utilization efficiency is less than 50%. This disadvantage influences the development of a powerfrugal TFT-LCD to some extent.

(2) The polarizers account for a large proportion in the production cost of TFT-LCD. On one hand, the cost is material cost and manufacturing cost. On the other hand, the cost is caused by high technical requirement. This disadvantage greatly restricts further reduction in the production cost of TFT-LCD.

(3) The pieces of polarizers in the prior art are attached to the surfaces of the array substrate and the color filter substrate, which also influences lighting and thinning of TFT-LCD to some extent.

SUMMARY

The subject of the present invention is to provide an array substrate of TFT-LCD and a method for manufacturing the same, so as to solve the technical problems such as high lights consumption and high cost of the attached polarizer structure in the prior art.

In order to accomplish the above subject, the present invention provides an array substrate of TFT-LCD, which includes gate lines and data lines formed in a substrate, pixel electrodes set in pixel regions defined by the gate lines and the data lines, and TFTs formed at intersections of the gate lines and the data lines, wherein a grid graph is formed on each of the pixel electrodes to make each of the pixel electrodes be simultaneously a built-in polarizer and change natural lights into linear polarized lights.

Each of the TFTs may be include:

a gate electrode formed on the substrate and connected to at least one of the gate lines;

a gate insulating layer formed on the gate electrode and the gate lines, and covering the whole substrate;

a semiconductor layer and a doped semiconductor layer formed on the gate insulating layer orderly, and located above the gate electrode;

a source electrode and a drain electrode formed on the doped semiconductor layer, and forming a TFT channel, in which the source electrode is connected to at least one of the data lines; and a passivation layer formed on the source electrode and the drain electrode, provided a passivation layer via hole corresponding to a position of the drain electrode so as to connect one of the pixel electrodes formed on the passivation layer to the drain electrode.

Alternatively, each of the TFTs may be includes:

a gate electrode formed on the substrate and connected to at least one of the gate lines;

a gate insulating layer formed on the gate electrode and the gate lines, and covering the whole substrate;

a semiconductor layer and a doped semiconductor layer formed on the gate insulating layer orderly, and located above the gate electrode;

a source electrode and a drain electrode formed on the doped semiconductor layer, and forming a TFT channel, wherein the source electrode is connected to at least one of the data lines, and the drain electrode and one of the pixel electrodes located at the same layer therewith are connected as an integrated structure; and a passivation layer formed on the source electrode and the drain electrode.

Based on the above technical solutions, the pixel electrodes are metal pixel electrodes having high electrical conductivity and easy to be etched. Preferably, the metal pixel electrodes are aluminum pixel electrodes.

A thickness of the pixel electrodes is 150 nm-250 nm.

The grid graph is an array consisting of a plurality of stripe grids etched on the surface of each of the pixel electrodes by using a holographic exposure method or a nano-imprint method. A width of each of the stripe grids is 20 nm-80 nm and a distance between centerlines of the adjacent stripe grids is 40 nm-160 nm. Preferably, the width of each of the stripe grids is 50 nm and the distance between the centerlines of the adjacent stripe grids is 100 nm.

In order to accomplish the above subject, the present application also provides a method for manufacturing an array substrate of TFT-LCD. The method includes the following steps:

step 1, depositing a layer of gate metal film on a substrate, and etching the gate metal film by using a mask process to form a graph comprising gate electrodes and gate lines on the substrate;

step 2, depositing a gate insulating layer, a semiconductor layer and a doped semiconductor layer continuously on the substrate having the graph comprising the gate electrodes and the gate lines, and etching the semiconductor layer and the doped semiconductor layer by using the mask process to form graphs of semiconductor layers and doped semiconductor layers above the gate electrodes; and step 3, forming graphs of source electrodes, drain electrodes, data lines and pixel electrodes on the substrate having the graphs of semiconductor layers and the doped semiconductor layers, wherein a grid graph is formed on each of the pixel electrodes to make each of the pixel electrodes be simultaneously a built-in polarizer and change natural lights into linear polarized lights.

The step 3 may be include the following steps:

depositing a layer of source-drain metal film on the substrate having the graphs of the semiconductor layers and the doped semiconductor layers, etching the source-drain metal film by using the mask process to form graphs of the source electrodes, the drain electrodes and the data lines, and etching and totally removing the doped semiconductor layers between each of the source electrodes and each of the drain electrodes to form each of graphs of TFT channels between each of the source electrodes and each of the drain electrodes;

depositing a passivation layer on the substrate having the graphs of the source electrodes, the drain electrodes and the data lines, and etching the passivation layer by using the mask process to form a graph of the passivation layer and at the same time form passivation layer via holes corresponding to the positions of the drain electrodes; and depositing a layer of metal film on the substrate having the graph of the passivation layer, and etching the metal film by using the mask process to form the pixel electrodes connected to the drain electrodes through the passivation layer via holes and form a grid graph on each of the pixel electrodes to make each of the pixel electrodes be simultaneously a built-in polarizer and change natural lights into linear polarized lights.

Alternatively, the step 3 may be includes the following steps:

depositing a layer of metal film on the substrate having the graphs of the semiconductor layers and the doped semiconductor layers, and etching the metal film by using the mask process to form graphs of source electrodes, drain electrodes, data lines and pixel electrodes, wherein a grid graph is formed on each of the pixel electrodes connected to each of the drain electrodes as an integrated structure to make each of the pixel electrodes be simultaneously a built-in polarizer and change natural lights into linear polarized lights; and depositing a passivation layer on the substrate having the graphs of the source electrodes, the drain electrodes, the data lines and the pixel electrodes, and etching the passivation layer by using the mask process to remove the passivation layer on the graph of the pixel electrodes.

The present invention provides an array substrate of TFT-LCD and a method for manufacturing the same, which makes the pixel electrodes having the grid graphs polarize natural lights based on reflection principle, i.e. realize polarizing function while realizing the function of a pixel electrode so as to form the array substrate structure of TFT-LCD having a built-in polarizer in the present invention. Since the pixel electrodes in the present invention are taken as the built-in polarizer, there is no need to attach a polarizer of absorption type to the array substrate after being disposed with the color filter substrate as a cell, thereby reducing the production cost of the TFT-LCD and facilitating reduction of the thickness of the TFT-LCD. The prior art applying the polarizer of absorption type has a light consumption of more than 50% during polarizing. Compared with the prior art, the built-in polarizer in the present invention is a polarizer of reflection type, which accomplishes polarizing by reflecting and removing the unwanted lights during implementation. Although the lights reflected and removed by the polarizer are linear polarized lights too, a depolarization can be accomplished on the linear polarized lights after being dispersed and other processed, and the lights can be reused. Therefore, the present invention effectively solves the problem of lights consumption in the prior art thereby increasing the power utilization efficiency greatly. In addition, the present invention applies the pixel electrodes of metal material instead of indium tin oxide (ITO) transparent electrodes in the conventional LCD, which omits the conventional sputtering process of ITO, thereby simplifying the manufacturing process of elements. At the same time, the integrated structure of the polarizer and the pixel electrodes can omit the conventional producing process of the via hole, thereby simplifying the array structure and the producing process, which accomplishes integration of the polarizer and the array structure and further reduces the production cost of TFT-LCD.

The present invention will be described in more detail with reference to the drawings and embodiments.

| | |
|---|---|
| 1 | gate electrode; |
| 2 | gate line; |
| 3 | gate insulating layer; |
| 4 | semiconductor layer; |
| 5 | doped semiconductor layer; |
| 6 | source electrode; |
| 7 | drain electrode; |
| 8 | data line; |
| 9 | passivation layer; |
| 10 | substrate; |
| 11 | pixel electrode; |
| 11a | metal film; |
| 11b | photo resist; |
| 11c | grid graph. |

DETAILED DESCRIPTION

Figure 1:
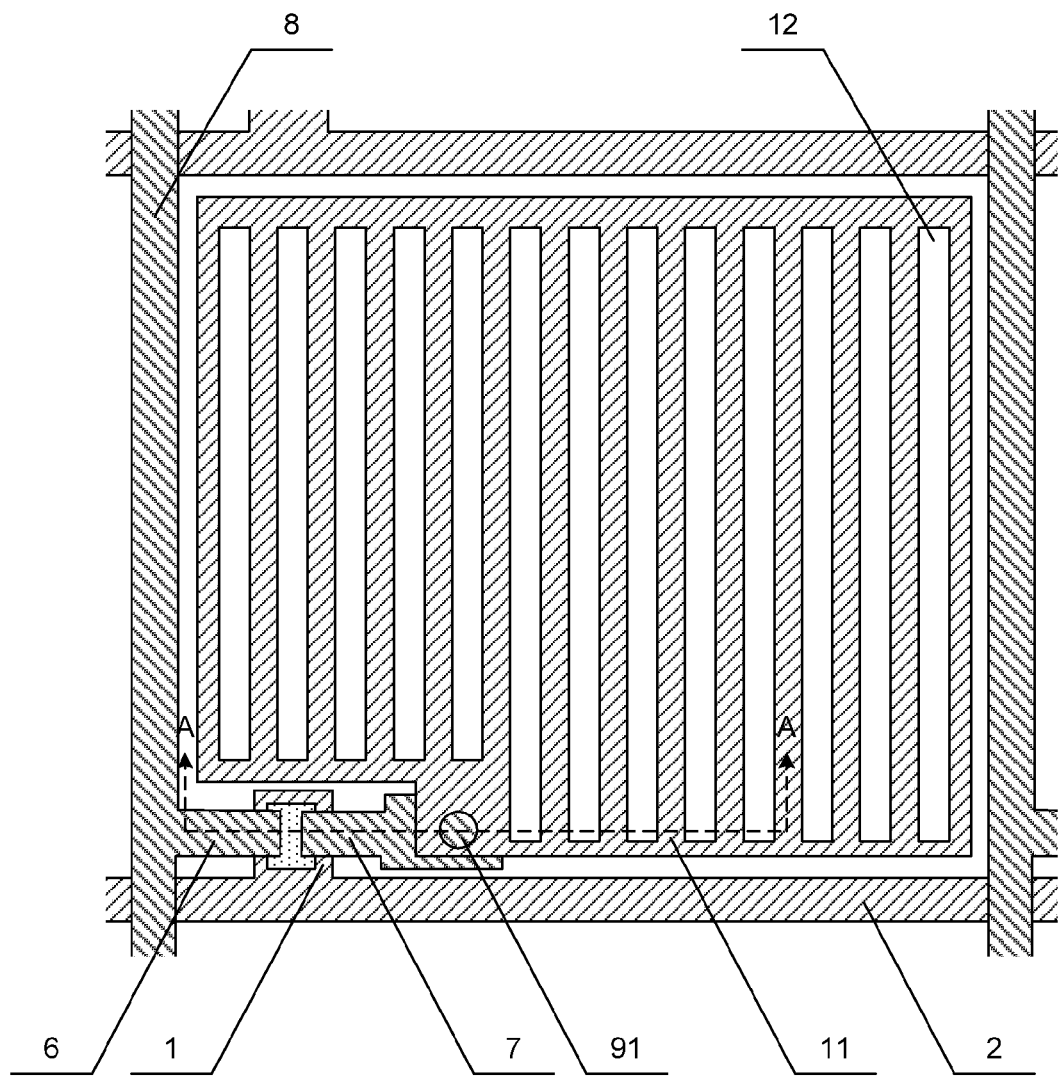
FIG. 1 is a plan view of the first embodiment of the array substrate of TFT-LCD according to the present invention.
Figure 2:
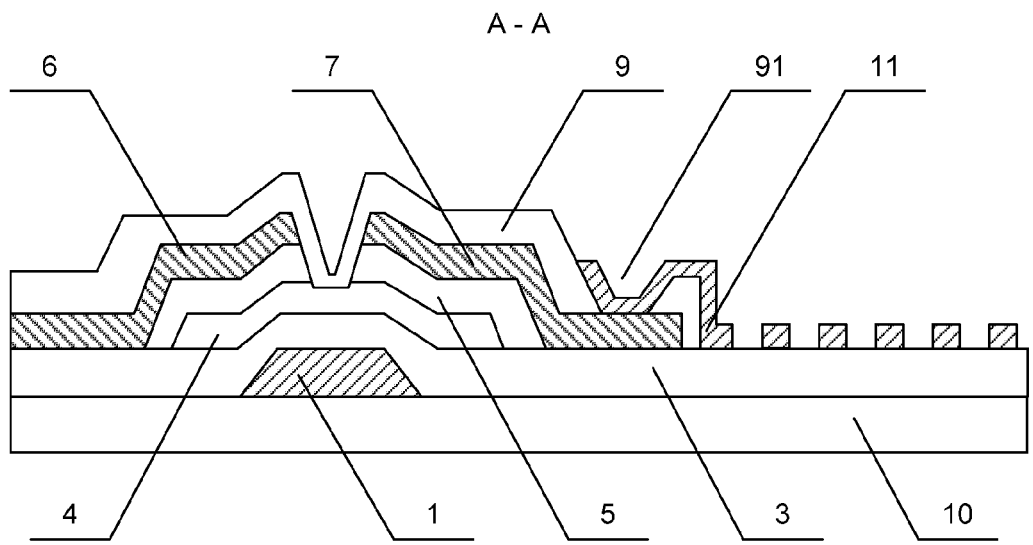
FIG. 2 is a cross-section view along line A-A in FIG. 1.

FIG. 1 is a plan view of the first embodiment of the array substrate of TFT-LCD according to the present invention. FIG. 2 is a cross-section view along line A-A in FIG. 1. As shown in FIG. 1 and FIG. 2, the array substrate of TFT-LCD in the present embodiment includes gate lines 2 and data lines 8 disposed vertically and across, and they are insulating with each other. The gate lines 2 and the data lines 8 define pixel regions. A pixel electrode 11 is formed in each pixel region. TFTs are formed at intersections of the gate lines and the data lines. Especially, each TFT includes a gate electrode 1 formed on a substrate 10, a gate insulating layer 3 formed on the gate electrode 1 and the gate line 2 and covering the whole substrate 10, a semiconductor layer 4 and a doped semiconductor layer 5 formed on the gate insulating layer 3 and located above each gate electrode 1, a source electrode 6 and a drain electrode 7 formed on the doped semiconductor layer 5 and forming a TFT channel, a passivation layer 9 formed on the source electrode 6 and the drain electrode 7, and a passivation layer via hole 91 formed in the passivation layer 9 and located in the position of the drain electrode 7. Each gate line 2 is connected to each gate electrode 1 respectively. Each data line 8 is connected to each source electrode 6 respectively. Each pixel electrode 11 is connected to each drain electrode 7 through each passivation layer via hole 91 respectively. Further, a grid graph 12 is formed on each pixel electrode 11 of the present embodiment. The grid graph 12 can change natural lights into linear polarized lights, which enables the pixel electrode 11 having the grid graph to polarize natural lights based on reflection principle, i.e. realize polarizing function while realizing the function of pixel electrode so as to form the array substrate structure of TFT-LCD having a built-in polarizer in the present embodiment.

FIG. 3-FIG. 7d are manufacturing schematic view of the present embodiment of the array substrate of TFT-LCD, and all of them are cross-section views along line A-A in FIG. 1. The technical solution of the present embodiment will be described in more detail through the process of manufacturing the array substrate of TFT-LCD. In the following description, a mask process called in the present invention includes coating photo resist, masking, exposing, and etching and so on.

Figure 3:
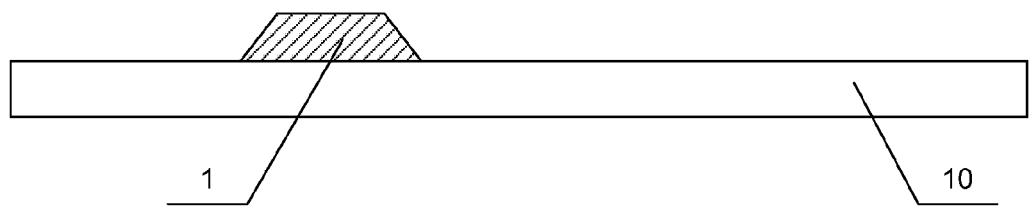
FIG. 3 is a schematic view of the first embodiment of the array substrate after forming the graph including the gate electrode and the gate line according to the present invention.

FIG. 3 is a schematic view of the first embodiment of the array substrate after forming the graph including the gate electrode and the gate line according to the present invention. Depositing a layer of gate metal film on the substrate 10 (for example a glass substrate or a quartz substrate) by means of a sputtering method or an electron beam evaporation method. Etching the gate metal film by using a mask process to form a graph including the gate electrodes 1 and the gate lines on the substrate 10, as shown in FIG. 3.

Figure 4:
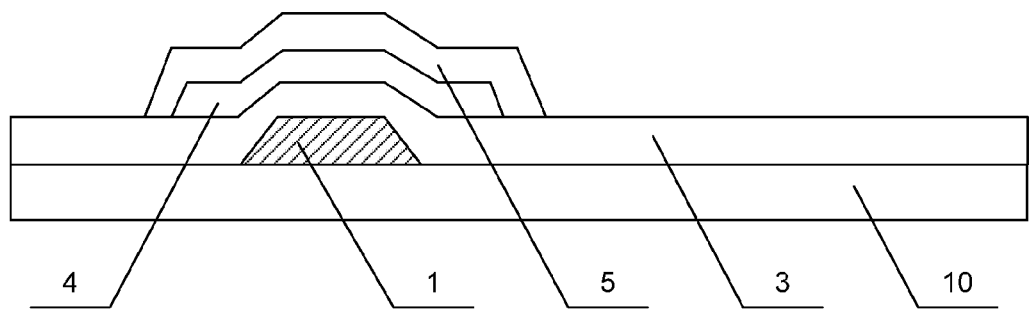
FIG. 4 is a schematic view of the first embodiment of the array substrate after forming the graph of the active layer according to the present invention.

FIG. 4 is a schematic view of the first embodiment of the array substrate after forming the graph of the active layer according to the present invention. By using a plasma enhanced chemical vapor deposition (PECVD) method, depositing the gate insulating layer 3, the semiconductor layer 4 and the doped semiconductor layer (ohmic contact layer) 5 continuously on the substrate after forming the graph including the gate electrodes and the gate lines. The semiconductor layer 4 and the doped semiconductor layer 5 compose an active layer. The semiconductor layer 4 may be an amorphous silicon layer. The doped semiconductor layer 5 may be a doped amorphous silicon layer. After depositing the above layers, the semiconductor layer and the doped semiconductor layer are etched by using the mask process to form graphs of each semiconductor layer 4 and each doped semiconductor layer 5 above each gate electrode 1, as shown in FIG. 4.

Figure 5:
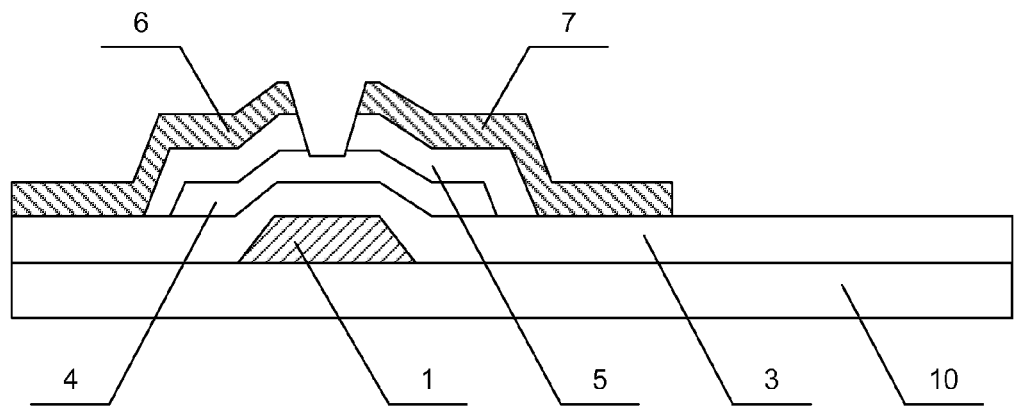
FIG. 5 is a schematic view of the first embodiment of the array substrate after forming the graph including the source/drain electrode and the data line according to the present invention.

FIG. 5 is a schematic view of the first embodiment of the array substrate after forming the graph including the source-drain electrode and the data line according to the present invention. After forming the graphs of the semiconductor layers and the doped semiconductor layers, a layer of source-drain metal film is deposited by means of a sputtering method or an electron beam evaporation method, the source-drain metal film is etched by using the mask process so as to form a graph including source electrodes 6, drain electrodes 7 and data lines, and each doped semiconductor layer 5 between each source electrode 6 and each drain electrode 7 is totally removed by etching so as to form a graph including the TFT channel between each source electrode 6 and each drain electrode 7, as shown in FIG. 5.

Figure 6:
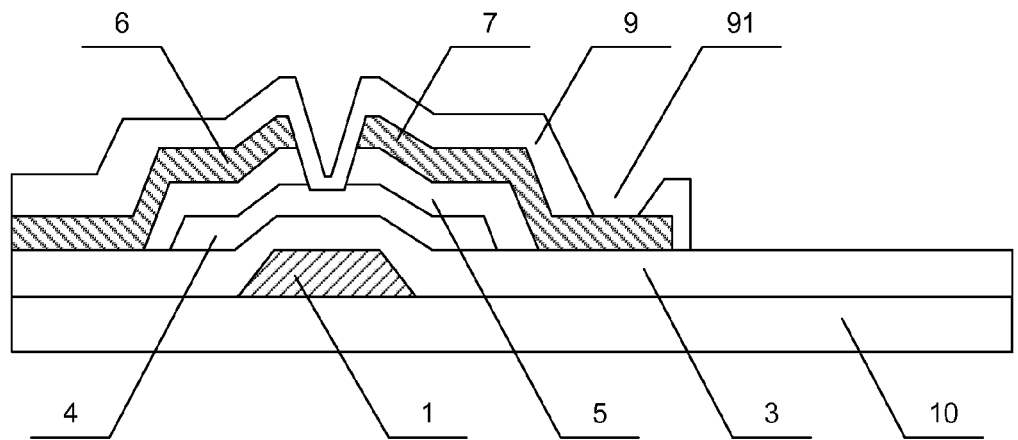
FIG. 6 is a schematic view of the first embodiment after forming the passivation layer via hole according to the present invention.

FIG. 6 is a schematic view of the first embodiment of the array substrate after forming the passivation layer via hole according to the present invention. After forming the graph including the source electrodes, the drain electrodes, the data lines and the TFT channels, a passivation layer 9 is deposited by means of PECVD method. The passivation layer 9 is etched by using the mask process to form a passivation layer via hole 91 corresponding to the position of each drain electrode 7 whilst forming the graph of the passivation layer, as shown in FIG. 6.

Figure 7A:
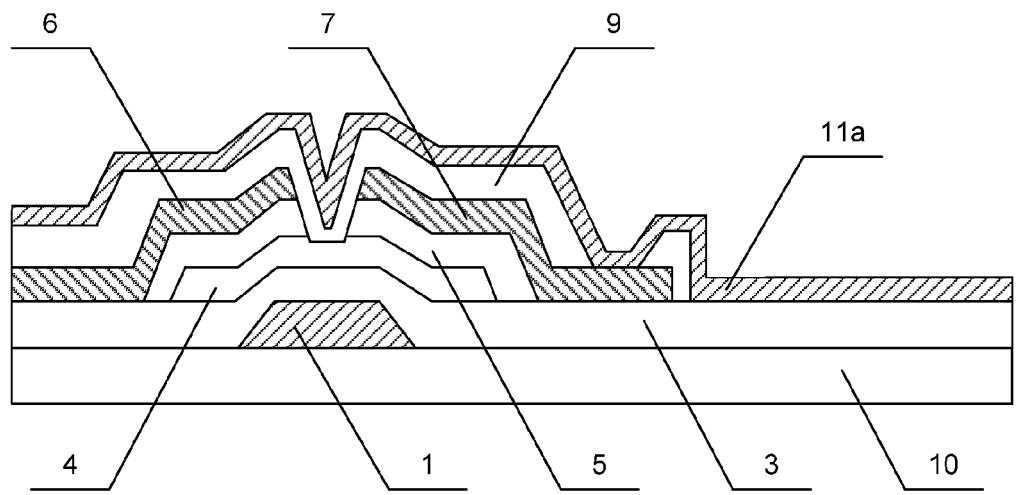
FIG. 7a-FIG. 7d are schematic views of the first embodiment of the array substrate of forming the grid graph according to the present invention.
Figure 7B:
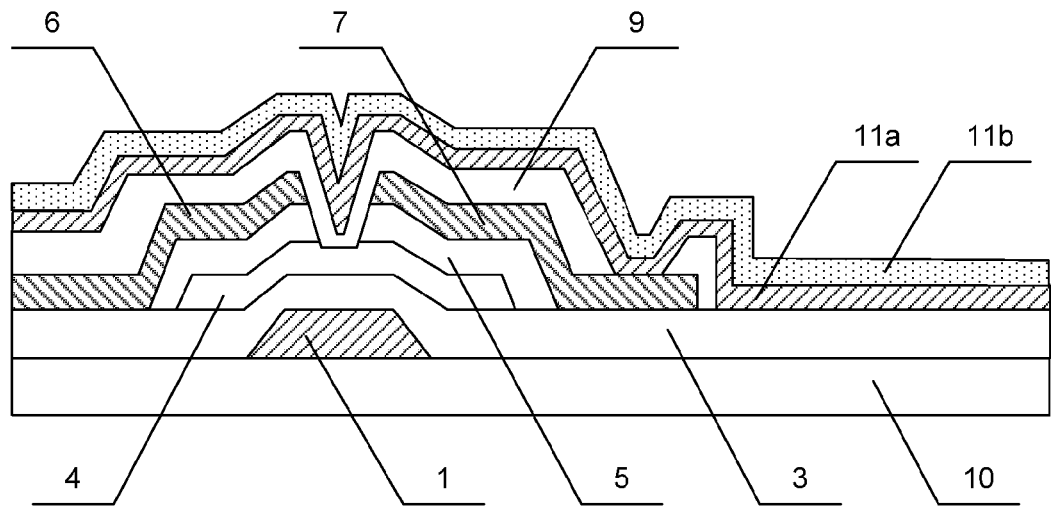
Figure 7C:
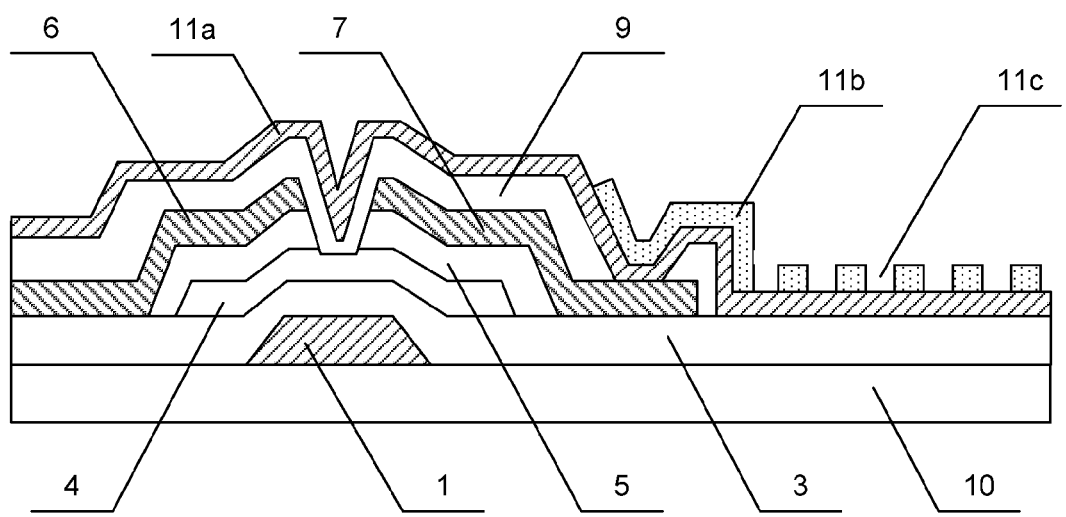
Figure 7D:
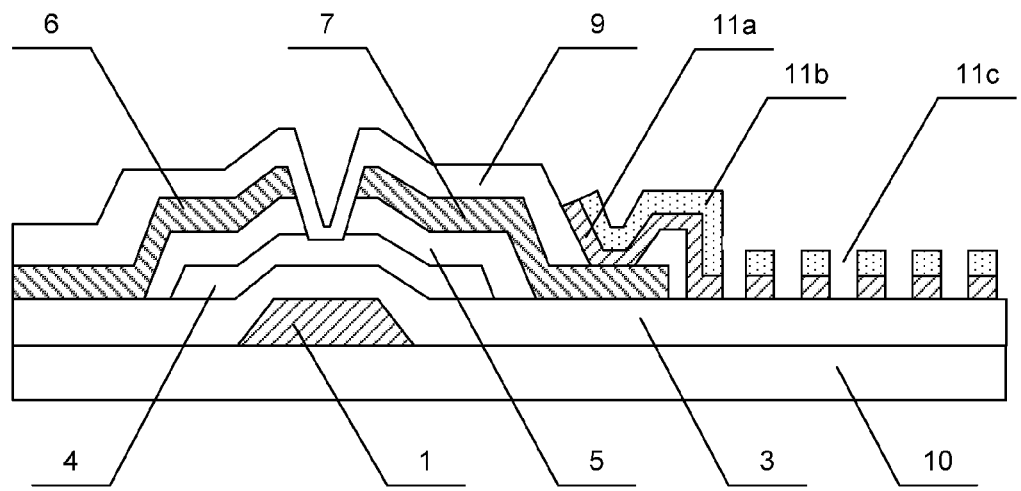

FIG. 7a-FIG. 7d are schematic views of the first embodiment of the array substrate forming the grid graph according to the present invention. By means of a sputtering method or an electron beam evaporation method, a layer of metal film 11a having high electrical conductivity and easy to be etched is deposited, in which a thickness of the metal film 11a is 150 nm-250 nm, as shown in FIG. 7a. The metal film 11a is preferably aluminum, and its thickness is preferably 200 nm. A layer of photo resist 11b is coated on the metal film 11a, as shown in FIG. 7b. Then the graph of the pixel electrodes is defined by using an optical exposure method. A grid graph 11c is defined on the photo resist 11b corresponding to the graph of each pixel electrode by means of a nano-imprint method, as shown in FIG. 7c. The graphs of the pixel electrodes and grid graphs are manufactured synchronously by using a wet etching method or a dry etching method. Each pixel electrode 11 is connected to each drain electrode 7 through each passivation layer via hole, as shown in FIG. 7d. Finally, the photo resist on the surface of the pixel electrodes is removed by using an $O_2$ plasma ashing process so as to form the array substrate structure of TFT-LCD having the built-in polarizer in the present embodiment, as shown in FIG. 1 and FIG. 2.

Figure 8:
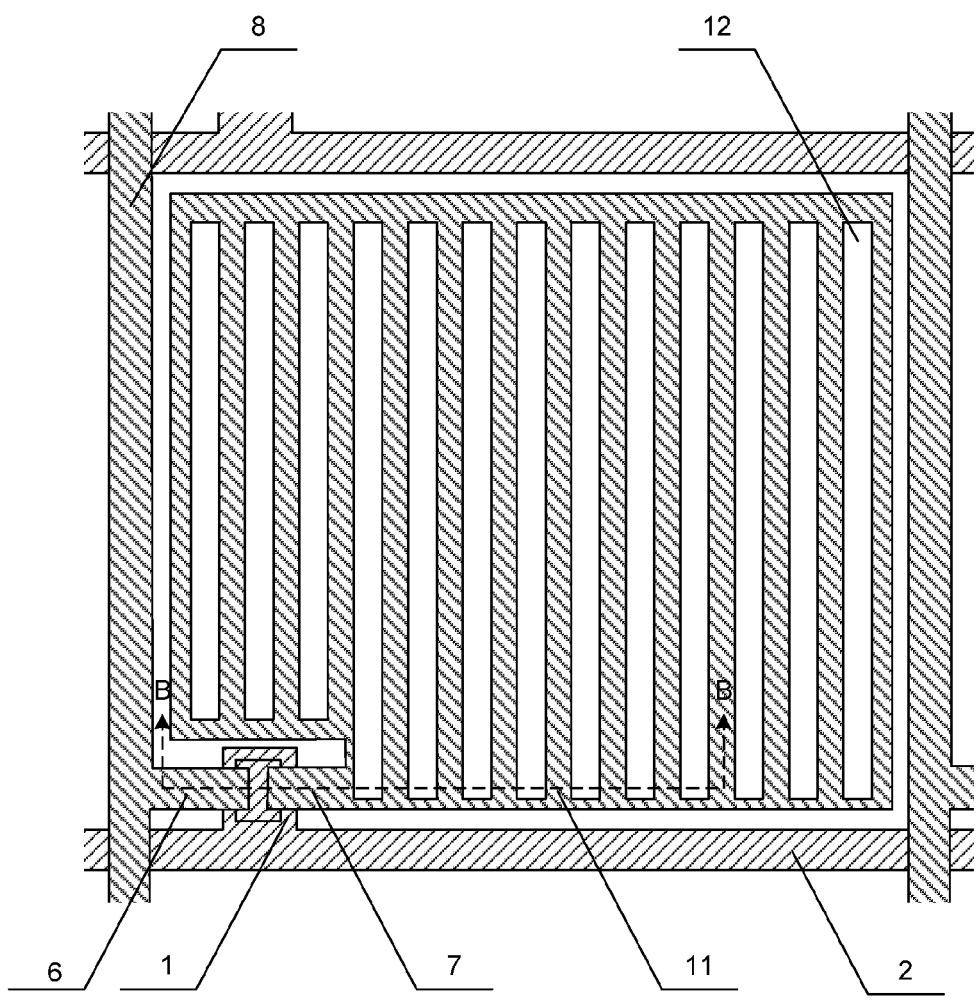
FIG. 8 is a plan view of the second embodiment of the array substrate of TFT-LCD according to the present invention.
Figure 9:
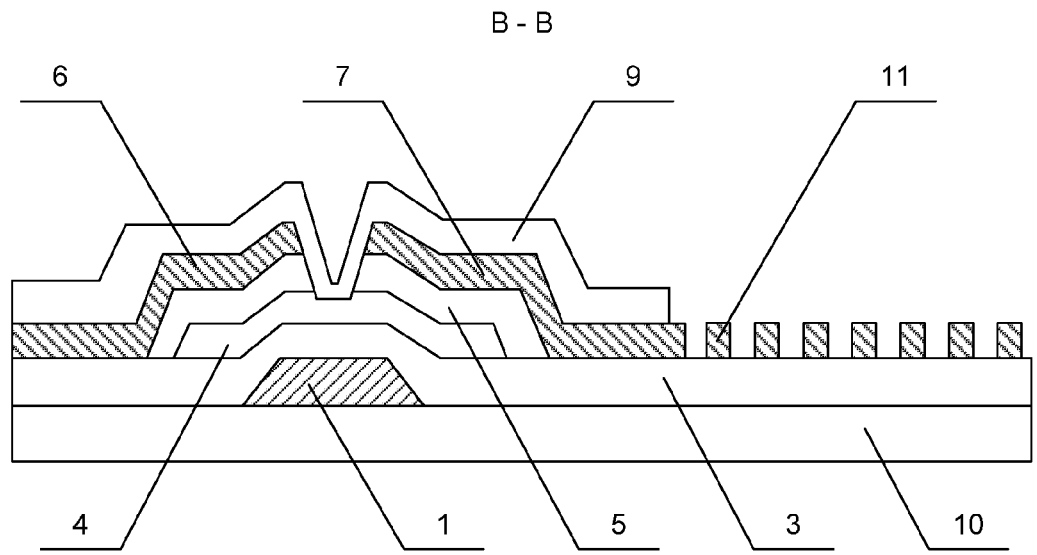
FIG. 9 is a cross-section view along line B-B in FIG. 8.

FIG. 8 is a plan view of the second embodiment of the array substrate of TFT-LCD according to the present invention. FIG. 9 is a cross-section view along line B-B in FIG. 8. As shown in FIG. 8 and FIG. 9, the array substrate of TFT-LCD in the present embodiment includes gate lines 2 and data lines 8 disposed vertically and across, and they are insulating with each other. The gate lines 2 and the data lines 8 define pixel regions. A pixel electrode 11 is formed in each pixel region. TFTs are formed at intersections of the gate lines and the data lines. Especially, each TFT includes a gate electrode 1 formed on a substrate 10, a gate insulating layer 3 formed on the gate electrode 1 and the gate line 2 and covering the whole substrate 10, a semiconductor layer 4 and a doped semiconductor layer 5 formed on the gate insulating layer 3 and located above each gate electrode 1, a source electrode 6 and a drain electrode 7 formed on the doped semiconductor layer 5 and forming a TFT channel. Each source electrode 6, each drain electrode 7 and each pixel electrode 11 are in the same layer. Each TFT finally includes a passivation layer 9 formed on the source electrode 6 and the drain electrode 7. Each gate line 2 is connected to each gate electrode 1 respectively. Each data line 8 is connected to each source electrode 6 respectively. Each pixel electrode 11 and each drain electrode 7 are connected as an integrated structure. Further, a grid graph 12 is formed on each pixel electrode 11 of the present embodiment. The grid graph 12 can change natural lights into linear polarized lights, which makes the pixel electrode 11 having the grid graph polarizes natural lights based on reflection principle, i.e. realize polarizing function while realizing the function of pixel electrode so as to form the array substrate structure of TFT-LCD having a built-in polarizer in the present embodiment.

FIG. 10-FIG. 13d are manufacturing schematic view of the present embodiment of the array substrate of TFT-LCD, and all of them are cross-section views along line B-B in FIG. 8. The technical solution of the present embodiment will be described in more detail through the process of manufacturing the array substrate of TFT-LCD.

Figure 10:
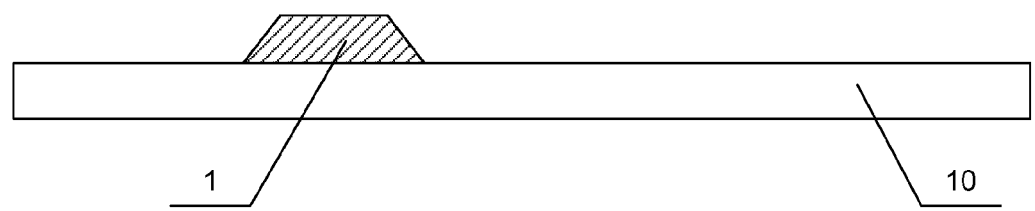
FIG. 10 is a schematic view of the second embodiment of the array substrate after forming the graph including the gate electrode and the gate line according to the present invention.

FIG. 10 is a schematic view of the second embodiment of the array substrate after forming the graph including the gate electrode and the gate line according to the present invention. A layer of gate metal film is deposited on the substrate 10 (for example a glass substrate or a quartz substrate) by means of a sputtering method or an electron beam evaporation method. The gate metal film is etched by using a mask process to form a graph including the gate electrodes 1 and the gate lines on the substrate 10, as shown in FIG. 10.

Figure 11:
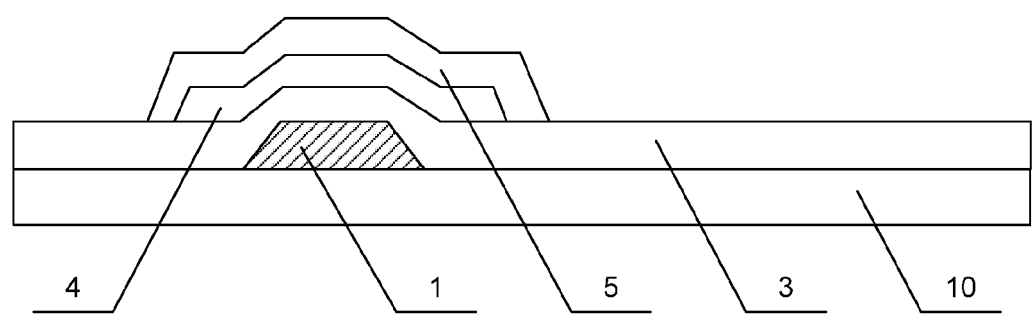
FIG. 11 is a schematic view of the second embodiment of the array substrate after forming the graph of the active layer according to the present invention.

FIG. 11 is a schematic view of the second embodiment of the array substrate after forming the graph of the active layer according to the present invention. By using the PECVD method, the gate insulating layer 3, the semiconductor layer 4 and the doped semiconductor layer 5 are deposited continuously on the substrate after forming the graph including the gate electrodes and the gate lines. The semiconductor layer 4 and the doped semiconductor layer 5 compose an active layer. The semiconductor layer 4 may be an amorphous silicon layer. The doped semiconductor layer 5 may be a doped amorphous silicon layer. After depositing the above layers, the semiconductor layer and the doped semiconductor layer are etched by using the mask process to form graphs of each semiconductor layer 4 and each doped semiconductor layer 5 above each gate electrode 1, as shown in FIG. 11.

Figure 12A:
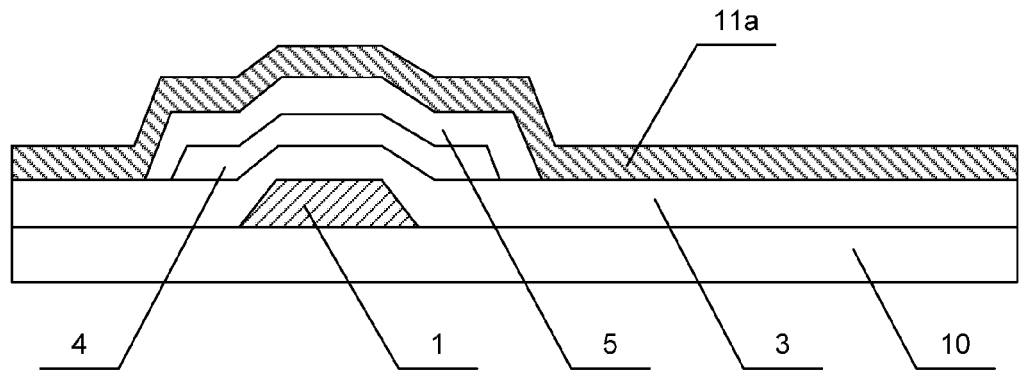
FIG. 12a-FIG. 12d are schematic views of the second embodiment of the array substrate of forming the source electrode, the drain electrode, the data line and the grid graph according to the present invention.
Figure 12B:
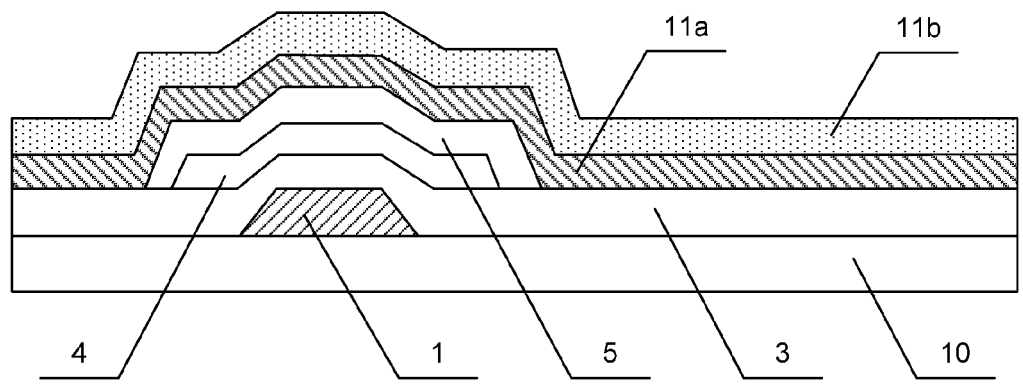
Figure 12C:
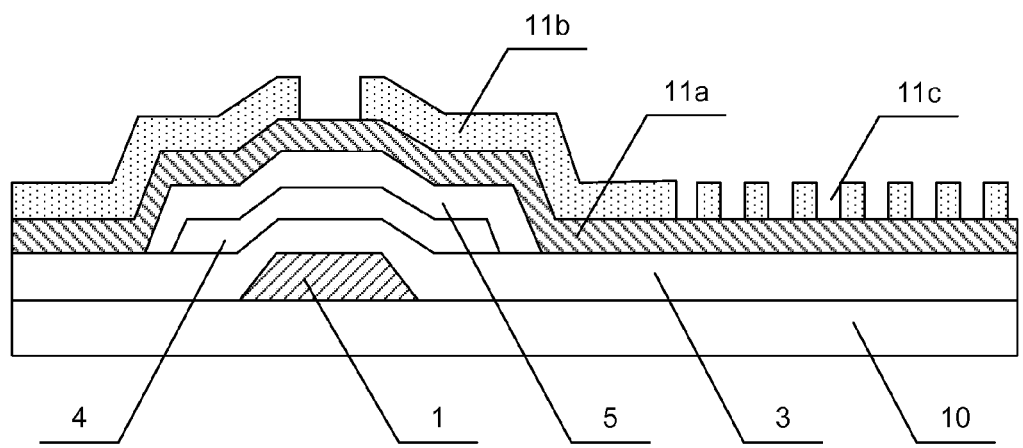
Figure 12D:
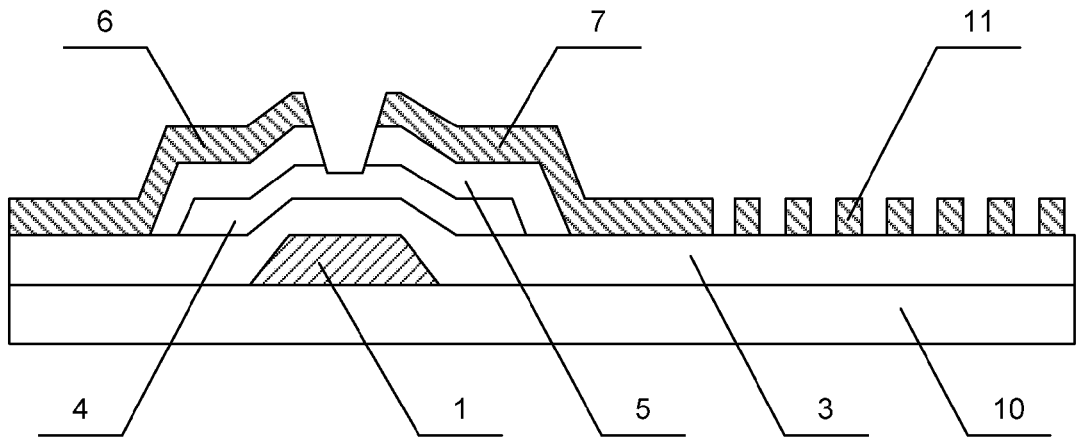

FIG. 12a-FIG. 12d are schematic views of the second embodiment of the array substrate of forming the source electrode, the drain electrode, the data line and the grid graph according to the present invention. After forming the graphs of the semiconductor layers and the doped semiconductor layers, by means of a sputtering method or an electron beam evaporation method, a layer of metal film 11a having high electrical conductivity and easy to be etched is deposited, in which a thickness of the metal film 11a is 150 nm-250 nm, as shown in FIG. 12a. The metal film 11a is preferably aluminum, and its thickness is preferably 200 nm. A layer of photo resist 11b is coated on the metal film 11a, as shown in FIG. 12b. Then the graphs of the source electrodes, the drain electrodes, the data lines and the pixel electrodes are defined by using an optical exposure method. A grid graph 11c is defined on the photo resist 11b corresponding to the graph of each pixel electrode by means of the nano-imprint method, as shown in FIG. 12c. The graphs of the source electrodes 6, the drain electrodes 7, the data lines and the pixel electrodes 11, and the grid graphs on the pixel electrodes are manufactured synchronously by using a wet etching method or a dry etching method, and each doped semiconductor layer 5 between each source electrode 6 and each drain electrode 7 is totally removed by etching so as to form the TFT channel between each source electrode 6 and each drain electrode 7. Each drain electrode 7 is respectively connected to each pixel electrode 11 as an integrated structure. There is a grid graph formed on each pixel electrode. The grid graph changes the natural lights into the linear polarized lights so as to make the pixel electrode be taken as a built-in polarizer at the same time. Then, the photo resist on the source electrodes 6, the drain electrodes 7, the data lines and the pixel electrodes 11 is removed by using the $O_2$ plasma ashing process, as shown in FIG. 12d.

Finally, a passivation layer 9 is deposited by means of the PECVD method, and the passivation layer 9 is etched by using the mask process to etch and remove the passivation layer on the graph of the pixel electrodes so as to form the graph of the passivation layer. The grid graphs formed by the pixel electrodes can change the natural lights into the linear polarized lights, which enables the pixel electrodes having grid graphs to polarize natural lights based on reflection principle, i.e. realize polarizing function while realizing the function of pixel electrode so as to form the array substrate structure of TFT-LCD having a built-in polarizer in the present embodiment, as shown in FIG. 8 and FIG. 9.

The present invention provides an array substrate of TFT-LCD, which enables the pixel electrodes having grid graphs to polarize natural lights based on reflection principle, i.e. realize polarizing function while realizing the function of pixel electrode so as to form the array substrate structure of TFT-LCD having a built-in polarizer in the present invention. Since the pixel electrodes in the present invention are taken as the built-in polarizer, there is no need to attach the polarizer of absorption type to the array substrate after being disposed with the color filter substrate as a cell, thereby reducing the production cost of the TFT-LCD and facilitating reduction of the thickness of the TFT-LCD. The prior art applying the polarizer of absorption type has a light consumption of more than 50% during polarizing. Compared with the prior art, the built-in polarizer in the present invention is a polarizer of reflection type, which accomplishes polarizing by reflecting and removing the unwanted lights during implementation. Although the lights reflected and removed by the polarizer are linear polarized lights too, a depolarization can be accomplished on the linear polarized lights after being dispersed and other processed, and the lights can be reused. Therefore, the present invention effectively solves the problem of lights consumption in the prior art thereby increasing the power utilization efficiency greatly. In addition, the present invention applies the pixel electrodes of metal material instead of the ITO transparent electrodes in the conventional LCD, which omits the conventional sputtering process of ITO, thereby simplifying the manufacturing process of elements. At the same time, the integrated structure of the polarizer and the pixel electrodes can omit the conventional producing process of the via hole, thereby simplifying the array structure and the producing process, which accomplishes integration of the polarizer and the array structure and further reduces the production cost of TFT-LCD.

In the technical solutions of the above two embodiments in the present invention, the pixel electrodes are a metal material film with high electrical conductivity and easy to be etched, and the thickness of the metal material film is 150 nm-250 nm. The performance of being easy to be etched is easy to be etched by using the wet etching method or by using the dry etching method. Preferably, the pixel electrodes is aluminum (Al) film, and its thickness is 200 nm. The grid graph on each of the pixel electrodes is a periodic grid structure. Preferably, the grid graph is an array consisting of a plurality of stripe grids etched on the surface of the pixel electrode by using a holographic exposure method or a nano-imprint method. The grid graph is taken as a built-in polarizer as well as the pixel electrode. Under condition of practical use, a width of each stripe grid is 20 nm-80 nm and a distance between centerlines of the adjacent stripe grids is 40 nm-160 nm. Preferably, the width of each stripe grid is 50 nm and the distance between centerlines of the adjacent stripe grids is 100 nm. In addition, the direction of the plurality of stripe grids in length may be parallel or vertical to the aligned direction of the alignment film on the array substrate, or has an arbitrary angle with the aligned direction of the alignment film.

In the technical solutions of the above two embodiments in the present invention, only the technical solution that the grid graphs are defined by the nano-imprint method is described. Under condition of practical use, the grid graph may also be formed on the pixel electrode by means of the holographic exposure method. Particularly, a layer of photo resist (holographic exposure adhesive) is coated on the metal film, a holographic exposure is implemented based on a laser interference principle to define a wanted graph. Then, the exposed graphs are developed and dried to be shaped. The metal film etched by using a reactive ion etching (RIE) or an inductive couple plasmas (ICP) high density etching method to manufacture the graphs of the pixel electrodes and the grid graphs. Finally, the photo resist is removed by using for example the $O_2$ plasma ashing process.

The embodiments of the present invention also provide a method for manufacturing the array substrate of TFT-LCD. The method comprises the following steps:

depositing a layer of gate metal film on a substrate, and etching the gate metal film by using a mask process to form a graph comprising gate electrodes and gate lines on the substrate;

depositing a gate insulating layer, a semiconductor layer and a doped semiconductor layer continuously on the substrate having the graph comprising the gate electrodes and the gate lines, and etching the semiconductor layer and the doped semiconductor layer by using the mask process to form graphs of semiconductor layers and doped semiconductor layers above the gate electrodes; and forming graphs of source electrodes, drain electrodes, data lines and pixel electrodes on the substrate having the graphs of semiconductor layers and the doped semiconductor layers, wherein a grid graph is formed on each of the pixel electrodes to make each of the pixel electrodes be simultaneously a built-in polarizer and change natural lights into linear polarized lights.

Figure 13:
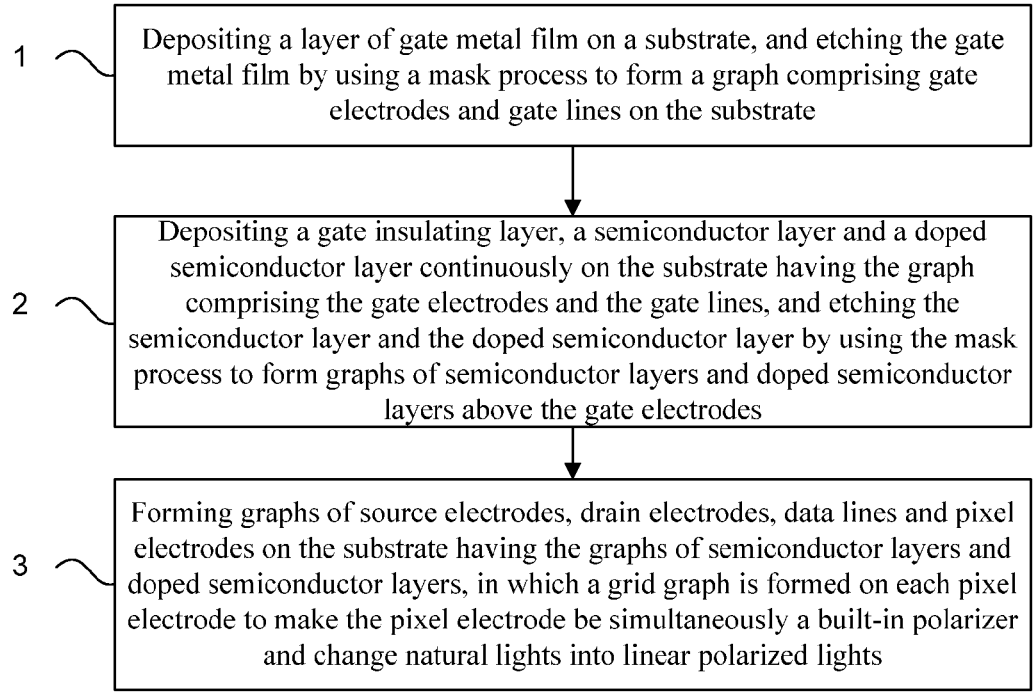
FIG. 13 is a flow chart of the method for manufacturing the array substrate of TFT-LCD according to the present invention.

FIG. 13 is a flow chart of the method for manufacturing the array substrate of TFT-LCD according to the present invention. The method specifically includes the following steps:

Step 1 is to deposit a layer of gate metal film on a substrate, and etch the gate metal film by using a mask process to form a graph including gate electrodes and gate lines on the substrate;

Step 2 is to deposit a gate insulating layer, a semiconductor layer and a doped semiconductor layer continuously on the substrate having the graph including the gate electrodes and the gate lines, and etch the semiconductor layer and the doped semiconductor layer by using the mask process to form graphs of semiconductor layers and doped semiconductor layers above the gate electrodes; and Step 3 is to form graphs of source electrodes, drain electrodes, data lines and pixel electrodes on the substrate having the graphs of semiconductor layers and doped semiconductor layers, in which a grid graph is formed on each pixel electrode to make the pixel electrode be simultaneously a built-in polarizer and change natural lights into linear polarized lights.

The present invention provides a method for manufacturing an array substrate of TFT-LCD, which can form the pixel electrodes having the grid graphs. These pixel electrodes can polarize natural lights based on reflection principle, i.e. realize polarizing function while realizing the function of pixel electrode so as to form the array substrate structure of TFT-LCD having a built-in polarizer. Since the pixel electrodes in the present invention are taken as the built-in polarizer, there is no need to attach a polarizer of absorption type to the array substrate after being disposed with the color filter substrate as a cell, thereby reducing the production cost of the TFT-LCD and facilitating reduction of the thickness of the TFT-LCD. The prior art applying the polarizer of absorption type has a light consumption of more than 50% during polarizing. Compared with the prior art, the built-in polarizer in the present invention is a polarizer of reflection type, which accomplishes polarizing by reflecting and removing the unwanted lights during implementation. Although the lights reflected and removed by the polarizer are linear polarized lights too, a depolarization can be accomplished on the linear polarized lights after being dispersed and other processed, and the lights can be reused. Therefore, the present invention effectively solves the problem of lights consumption in the prior art thereby increasing the power utilization efficiency greatly.

Figure 14:
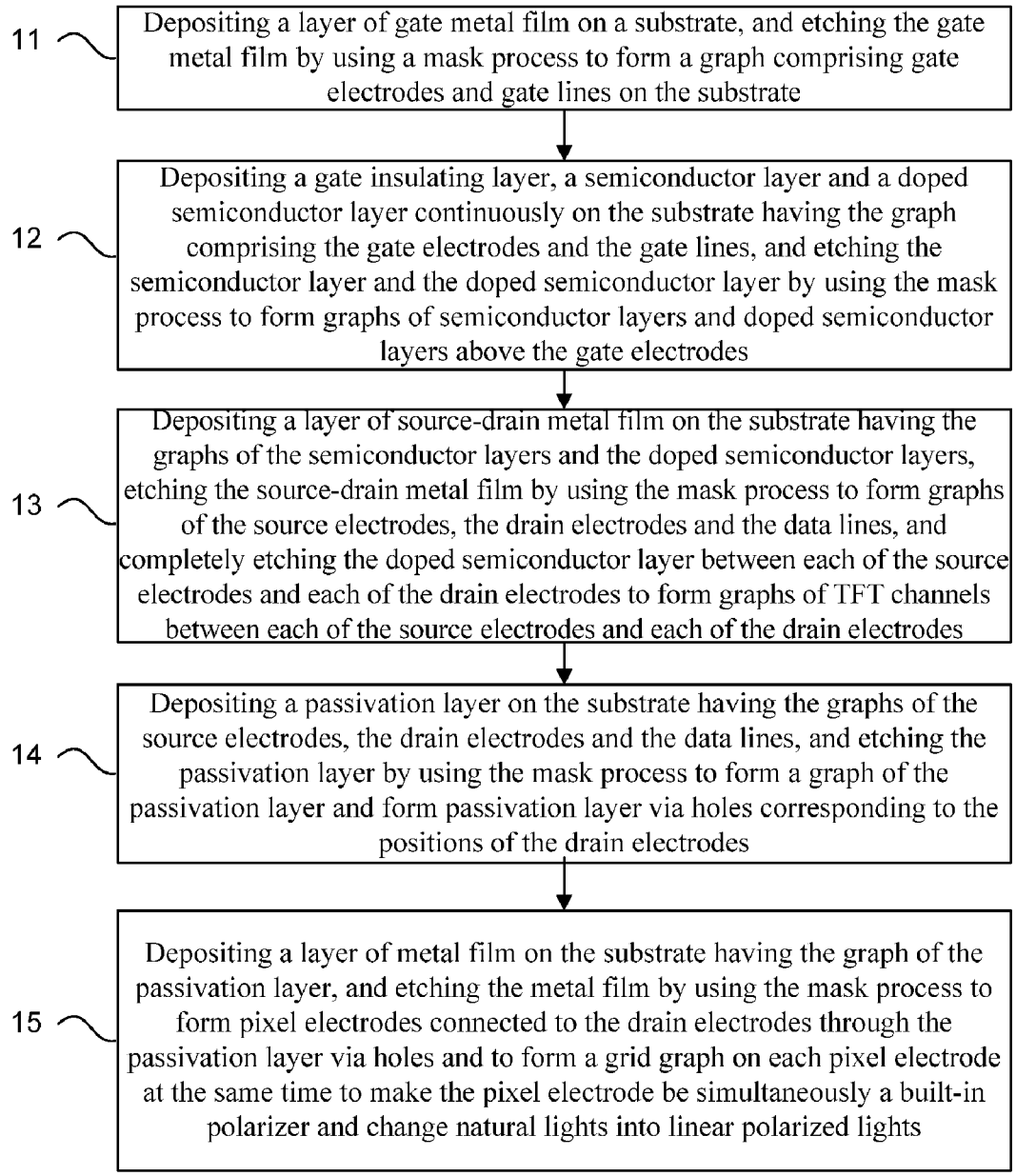
FIG. 14 is a flow chart of the first embodiment of the method for manufacturing the array substrate of TFT-LCD according to the present invention.

FIG. 14 is a flow chart of the first embodiment of the method for manufacturing the array substrate of TFT-LCD according to the present invention. The method specifically includes the following steps:

Step 11 is to deposit a layer of gate metal film on a substrate, and etch the gate metal film by using a mask process to form a graph including gate electrodes and gate lines on the substrate;

Step 12 is to deposit a gate insulating layer, a semiconductor layer and a doped semiconductor layer continuously on the substrate having the graph including the gate electrodes and the gate lines, and etch the semiconductor layer and the doped semiconductor layer by using the mask process to form graphs of semiconductor layers and doped semiconductor layers above the gate electrodes;

Step 13 is to deposit a layer of source-drain metal film on the substrate having the graphs of the semiconductor layers and the doped semiconductor layers, etch the source-drain metal film by using the mask process to form graphs of the source electrode, the drain electrodes and the data lines, and completely etch and remove the doped semiconductor layer between each of the source electrodes and each of the drain electrodes to form graphs of TFT channels between each of the source electrodes and each of the drain electrodes;

Step 14 is to deposit a passivation layer on the substrate having the graphs of the source electrodes, the drain electrodes and the data lines, and etch the passivation layer by using the mask process to form a graph of the passivation layer and at the same time form passivation layer via holes corresponding to the positions of the drain electrodes; and Step 15 is to deposit a layer of metal film on the substrate having the graph of the passivation layer, and etch the metal film by using the mask process to form pixel electrodes connected to the drain electrodes through the passivation layer via holes and to form a grid graph on each of the pixel electrodes at the same time to make the pixel electrode be simultaneously a built-in polarizer and change natural lights into linear polarized lights.

Specifically, a layer of gate metal film is deposited on the substrate (for example a glass substrate or a quartz substrate) by means of a sputtering method or an electron beam evaporation method. The gate metal film is etched by using a mask process to form a graph including the gate electrodes and the gate lines on the substrate. By using a PECVD method, the gate insulating layer, the semiconductor layer and the doped semiconductor layer (ohmic contact layer) are deposited continuously on the substrate after forming the graph including the gate electrodes and the gate lines. The semiconductor layer and the doped semiconductor layer compose an active layer. The semiconductor layer may be an amorphous silicon layer. The doped semiconductor layer may be a doped amorphous silicon layer. After depositing the above layers, the semiconductor layer and the doped semiconductor layer are etched by using the mask process to form graphs of each semiconductor layer and each doped semiconductor layer above each gate electrode. After forming the graphs of the semiconductor layers and the doped semiconductor layers, a layer of source-drain metal film is deposited by means of a sputtering method or an electron beam evaporation method, and the source-drain metal film is etched by using the mask process to form a graph including source electrodes, drain electrodes and data lines, and each doped semiconductor layer between each source electrode and each drain electrode is totally removed by etching so as to form the graph of a TFT channel between each source electrode and each drain electrode. After forming the graph including the source electrodes, the drain electrodes, the data lines and the TFT channels, a passivation layer is deposited by means of PECVD method. The passivation layer is etched by using the mask process to form a passivation layer via hole corresponding to the position of each drain electrode while forming the graph of the passivation layer. A layer of metal film is deposited on the substrate having the graph of the passivation layer, and the metal film is etched by using the mask process to form pixel electrodes connected to the drain electrodes through the passivation layer via holes and to form a grid graph on each pixel electrodes at the same time to make the pixel electrode be simultaneously a built-in polarizer and change natural lights into linear polarized lights.

Figure 15:
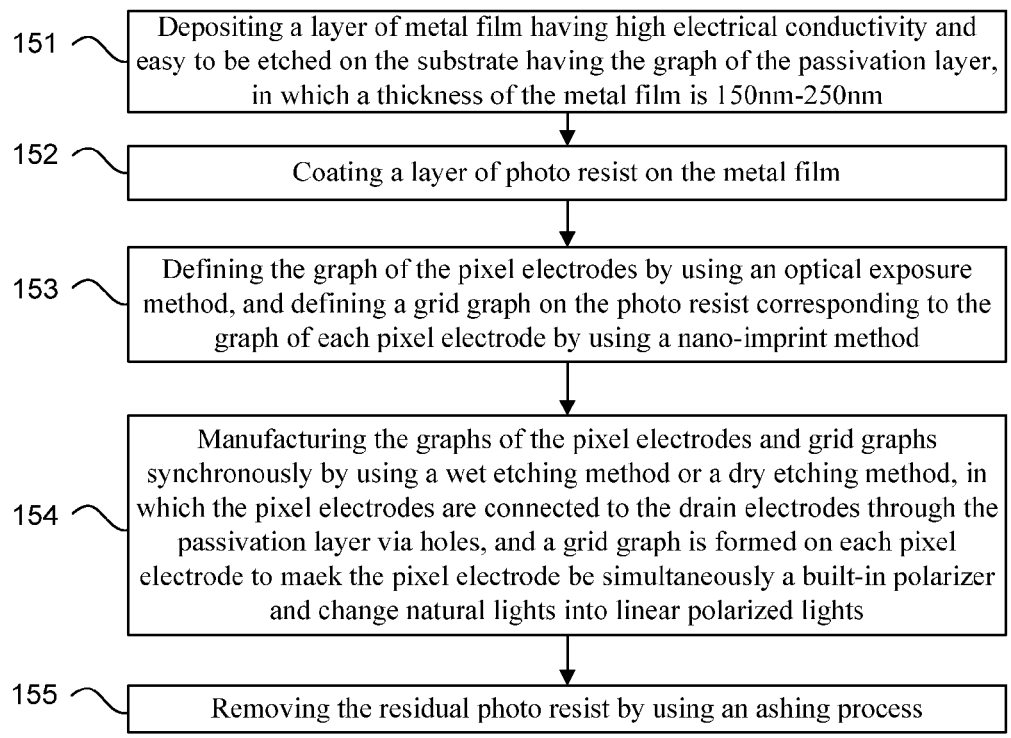
FIG. 15 is a flow chart of forming the grid graph in the first embodiment of the method according to the present invention.

FIG. 15 is a flow chart of forming the grid graph in the first embodiment of the method according to the present invention. The step 15 in the present embodiment specifically includes the following steps:

Step 151 is to deposit a layer of metal film having high electrical conductivity and easy to be etched on the substrate having the graph of the passivation layer, in which a thickness of the metal film is 150 nm-250 nm;

Step 152 is to coat a layer of photo resist on the metal film;

Step 153 is to define the graph of the pixel electrodes by using an optical exposure method, and define a grid graph on the photo resist corresponding to the graph of each pixel electrode by using a nano-imprint method;

Step 154 is to manufacture the graphs of the pixel electrodes and grid graphs synchronously by using a wet etching method or a dry etching method, in which the pixel electrodes are connected to the drain electrodes through the passivation layer via holes, and a grid graph is formed on each pixel electrode to make the pixel electrode be simultaneously a built-in polarizer and change natural lights into linear polarized lights; and Step 155 is to remove the residual photo resist by using an ashing process.

Specifically, by means of a sputtering method or an electron beam evaporation method, a layer of metal film having high electrical conductivity and easy to be etched is deposited on the substrate having the graph of the passivation layer, in which a thickness of the metal film is 150 nm-250 nm. The metal film is preferably aluminum, and its thickness is preferably 200 nm. A layer of photo resist is coated on the metal film. Then the graph of the pixel electrodes is defined by using an optical exposure method. A grid graph is defined on the photo resist corresponding to the graph of each pixel electrode by means of a nano-imprint method. Then the graphs of the pixel electrodes and grid graphs are manufactured synchronously by using a wet etching method or a dry etching method. Each pixel electrode is connected to each drain electrode through each passivation layer via hole. Finally, the photo resist on the surface of the pixel electrodes is removed by using an $O_2$ plasma ashing process so as to form the array substrate structure of TFT-LCD having the built-in polarizer in the present embodiment. Under condition of practical use, the grid graph is an array consisting of a plurality of stripe grids etched on the surface of the pixel electrode. A width of each stripe grid may be 20 nm-80 nm and a distance between centerlines of the adjacent stripe grids may be 40 nm-160 nm. Preferably, the width of each stripe grid is 50 nm and the distance between centerlines of the adjacent stripe grids is 100 nm. In addition, the direction of the plurality of stripe grids in length is parallel or vertical to the aligned direction of the alignment film on the array substrate, or has an arbitrary angle with the aligned direction of the alignment film.

Figure 16:
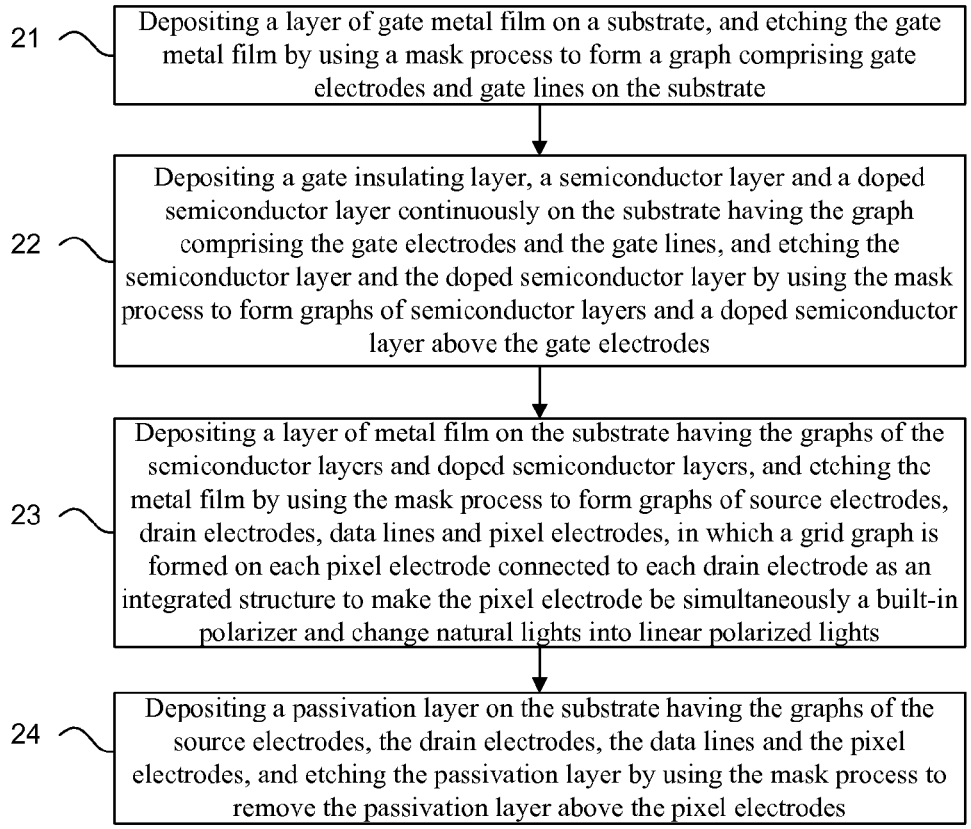
FIG. 16 is a flow chart of the second embodiment of the method for manufacturing the array substrate of TFT-LCD according to the present invention.

FIG. 16 is a flow chart of the second embodiment of the method for manufacturing the array substrate of TFT-LCD according to the present invention. The method specifically includes the following steps:

Step 21 is to deposit a layer of gate metal film on a substrate, and etch the gate metal film by using a mask process to form a graph including gate electrodes and gate lines on the substrate;

Step 22 is to deposit a gate insulating layer, a semiconductor layer and a doped semiconductor layer continuously on the substrate having the graph including the gate electrodes and the gate lines, and etch the semiconductor layer and the doped semiconductor layer by using the mask process to form graphs of semiconductor layers and doped semiconductor layers above the gate electrodes;

Step 23 is to deposit a layer of metal film on the substrate having the graphs of the semiconductor layers and the doped semiconductor layers, and etch the metal film by using the mask process to form graphs of source electrodes, drain electrodes, data lines and pixel electrodes, in which a grid graph is formed on each pixel electrode connected to each drain electrode as an integrated structure to make the pixel electrode be simultaneously a built-in polarizer and change natural lights into linear polarized lights; and Step 24 is to deposit a passivation layer on the substrate having the graphs of the source electrodes, the drain electrodes, the data lines and the pixel electrodes, and etch the passivation layer by using the mask process to remove the passivation layer on the pixel electrodes.

Specifically, a layer of gate metal film is deposited on the substrate (for example a glass substrate or a quartz substrate) by means of a sputtering method or an electron beam evaporation method. The gate metal film is etched by using a mask process to form a graph including the gate electrodes and the gate lines on the substrate. By using the PECVD method, the gate insulating layer, the semiconductor layer and the doped semiconductor layer are continuously deposited on the substrate after forming the graph including the gate electrodes and the gate lines. The semiconductor layer and the doped semiconductor layer compose an active layer. The semiconductor layer may be an amorphous silicon layer. The doped semiconductor layer may be a doped amorphous silicon layer. After depositing the above layers, the semiconductor layer and the doped semiconductor layer are etched by using the mask process to form graphs of each semiconductor layer and each doped semiconductor layer above each gate electrode. After forming the graphs of the semiconductor layers and the doped semiconductor layers, by means of a sputtering method or an electron beam evaporation method, a layer of metal film having high electrical conductivity and easy to be etched is deposit, in which a thickness of the metal film is 150 nm-250 nm. The metal film is etched by using the mask process to form graphs of source electrodes, drain electrodes, data lines and pixel electrodes. Each pixel electrode is connected to each drain electrode as an integrated structure. A grid graph is formed on each pixel electrode to make the pixel electrode be simultaneously a built-in polarizer and change natural lights into linear polarized lights. Finally, a passivation layer is deposited by means of the PECVD method, and the passivation layer is etched by using the mask process to remove the passivation layer on the graph of the pixel electrodes so as to form the graph of the passivation layer.

Figure 17:
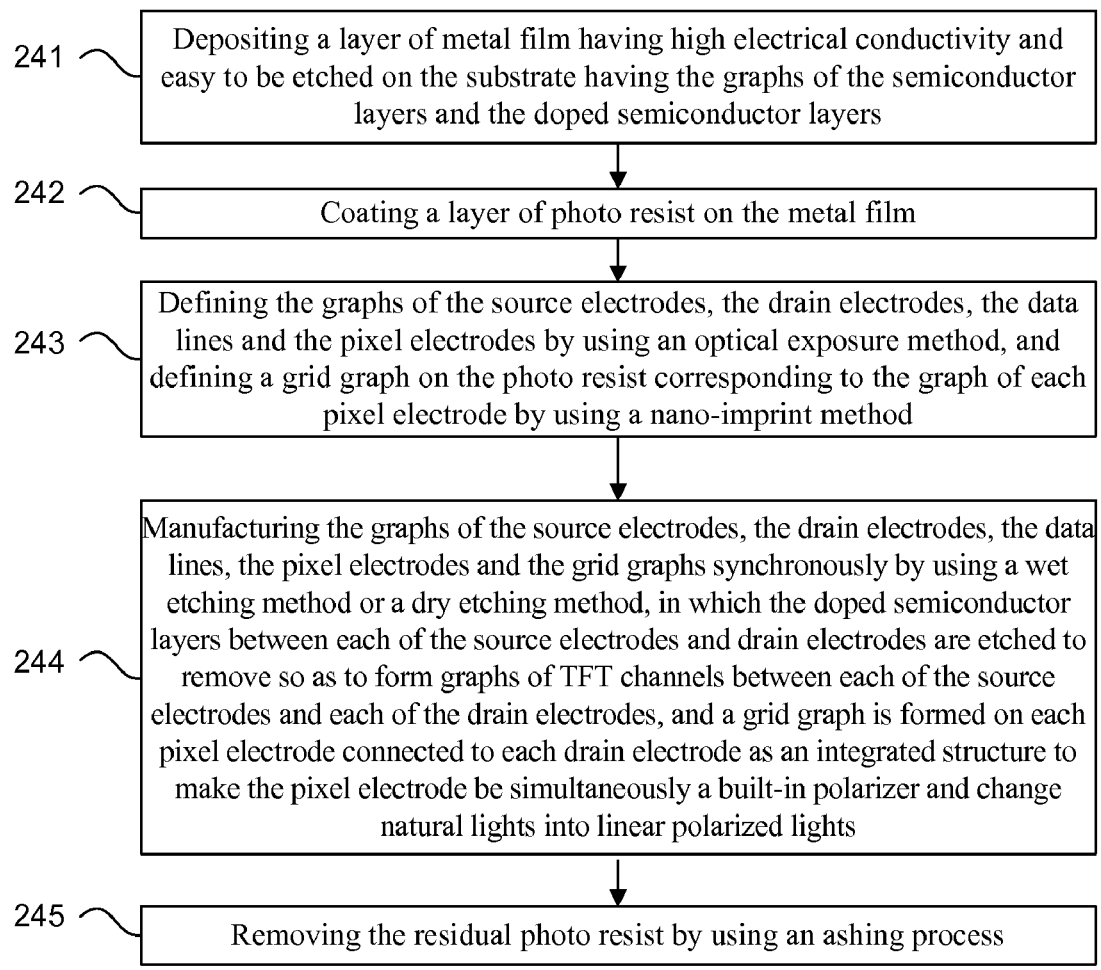
FIG. 17 is a flow chart of forming the grid graph in the second embodiment of the method according to the present invention.

FIG. 17 is a flow chart of forming the grid graph in the second embodiment of the method according to the present invention. The step 24 in the present embodiment specifically includes the following steps:

Step 241 is to deposit a layer of metal film having high electrical conductivity and easy to be etched on the substrate having the graphs of the semiconductor layers and the doped semiconductor layers, in which a thickness of the metal film is 150 nm-250 nm;

Step 242 is to coat a layer of photo resist on the metal film;

Step 243 is to define the graphs of the source electrodes, the drain electrodes, the data lines and the pixel electrodes by using an optical exposure method, and define a grid graph on the photo resist corresponding to the graph of each pixel electrode by using a nano-imprint method;

Step 244 is to manufacture the graphs of the source electrodes, the drain electrodes, the data lines and the pixel electrodes, and the grid graphs synchronously by using a wet etching method or a dry etching method, and etch and totally remove the doped semiconductor layers between each of the source electrodes and each of the drain electrodes so as to form graphs of TFT channels between each of the source electrodes and each of the drain electrodes, in which a grid graph is formed on each pixel electrode connected to each drain electrode as an integrated structure to make each of the pixel electrodes be simultaneously a built-in polarizer and change natural lights into linear polarized lights; and Step 245 is to remove the residual photo resist by using an ashing process.

Specifically, after forming the graphs of the semiconductor layers and the doped semiconductor layers, by means of a sputtering method or an electron beam evaporation method, a layer of metal film having high electrical conductivity and easy to be etched is deposited, in which a thickness of the metal film is 150 nm-250 nm. The metal film is preferably aluminum, and its thickness is preferably 200 nm. A layer of photo resist is coated on the metal film. Then the graphs of the source electrodes, the drain electrodes, the data lines and the pixel electrodes are defined by using an optical exposure method. A grid graph defined on the photo resist corresponding to the graph of each pixel electrode by means of the nano-imprint method. The graphs of the source electrodes, the drain electrodes, the data lines and the pixel electrodes, and the grid graphs on the pixel electrodes are synchronously manufactured by using a wet etching method or a dry etching method, and each doped semiconductor layer between each source electrode and each drain electrode is totally removed by etching so as to form the TFT channel between each source electrode and each drain electrode. Each drain electrode is respectively connected to each pixel electrode as an integrated structure. There is a grid graph formed on each pixel electrode. The grid graph changes the natural lights into the linear polarized lights so as to take the pixel electrode as a built-in polarizer simultaneously. Then, the photo resist on the source electrodes, the drain electrodes, the data lines and the pixel electrodes is removed by using the $O_2$ plasma ashing process. Under condition of practical use, the grid graph is an array consisting of a plurality of stripe grids etched on the surface of the pixel electrode. A width of each stripe grid may be 20 nm-80 nm and a distance between centerlines of the adjacent stripe grids may be 40 nm-160 nm. Preferably, the width of each stripe grid is 50 nm and the distance between centerlines of the adjacent stripe grids is 100 nm. In addition, the direction of the plurality of stripe grids in length is parallel or vertical to the aligned direction of the alignment film on the array substrate, or has an arbitrary angle with the aligned direction of the alignment film.

In the above embodiments of the present invention, the pixel electrodes apply metal material, which omits the conventional sputtering process of ITO, thereby simplifying the manufacturing process of elements. In addition, the integrated structure of the polarizer and the pixel electrodes can omit the producing process of the via holes, thereby simplifying the array structure and the producing process, which accomplishes integration of the polarizer and the array structure, and further reduces the production cost of TFT-LCD.

In the technical solutions of the above two embodiments in the present invention, only the technical solution that the grid graphs are defined by the nano-imprint method is described. Under condition of practical use, the grid graph can also be formed by the pixel electrode by means of the holographic exposure method. Particularly, a layer of photo resist (holographic exposure adhesive) is coated on the metal film, a holographic exposure is implemented based on a laser interference principle to define a wanted graph. Then, the exposed graphs are developed and dried to be shaped. The metal film is etched by using a reactive ion etching (RIE) or an inductive couple plasmas (ICP) high density etching to manufacture the graphs of the pixel electrodes and the grid graphs. Finally, the photo resist is removed by using the $O_2$ plasma ashing process.

It should be noted that the technology of metal grid polarizer (wire grid polarizer, WGP) applied in the above technical solution of the present invention has the following performances, such as simple structure, good integration, high efficiency of polarization, high reliability and no saturation of incident light intensity. Along with the development and gradual maturity of the nano-imprint technology, it is possible to produce the elements of WGP by large-scale production. Corresponding study indicates that when a metal grid polarizer is made of an aluminum (Al) thin film material of which a thickness is 200 nm, and the interparticle spacing is 100 nm and the width of stripe grid is 50 nm, the extinction ratio of the metal grid polarizer is up to 2000, and its transmission ratio is up to 85%. A result of a theoretical calculation indicates that its extinction ratio at the above parameters can even be up to 40000. When its size is suitable, its working wavelength can cover all visible light regions, and can even reach near-infrared waveband.

Finally, it should be noted that the above embodiments are merely provided for describing the technical solutions of the present invention, but not intended to limit the present invention. It should be understood by those of ordinary skill in the art that although the present invention has been described in detail with reference to the foregoing embodiments, modifications can be made to the technical solutions described in the foregoing embodiments, or equivalent replacements can be made to some technical features in the technical solutions but they do not depart from the spirit and scope of the present invention.

What is claimed is:

1. An array substrate of thin film transistor-liquid crystal display (TFT-LCD), comprising gate lines and data lines formed on a substrate, pixel electrodes set in pixel regions defined by the gate lines and the data lines, and TFTs formed at intersections of the gate lines and the data lines, wherein a grid graph is formed on each of the pixel electrodes to make each of the pixel electrodes be simultaneously a built-in polarizer and change natural lights into linear polarized lights wherein each of the TFTs comprises:
    a gate electrode formed on the substrate and connected to at least one of the gate lines;
    a gate insulating layer formed on the gate electrode and the gate lines, and covering the whole substrate;
    a semiconductor layer and a doped semiconductor layer formed on the gate insulating layer orderly, and located above the gate electrode;
    a source electrode and a drain electrode formed on the doped semiconductor layer, and forming a TFT channel, wherein the source electrode is connected to at least one of the data lines, and the drain electrode and one of the pixel electrodes located at the same layer therewith are connected as an integrated structure; and
    a passivation layer formed on the source electrode and the drain electrode.

2. The array substrate of TFT-LCD according to claim 1, wherein each of the pixel electrodes is a metal pixel electrode having high electrical conductivity and easy to be etched.

3. The array substrate of TFT-LCD according to claim 2, wherein each of the metal pixel electrodes is an aluminum pixel electrode.

4. The array substrate of TFT-LCD according to claim 1, wherein a thickness of each of the pixel electrodes is 150 nm-250 nm.

5. The array substrate of TFT-LCD according to claim 1, wherein the grid graph is an array consisting of a plurality of stripe grids etched on the surface of each of the pixel electrodes by using a holographic exposure method or a nano-imprint method.

6. The array substrate of TFT-LCD according to claim 5, wherein a width of each of the stripe grids is 20 nm-80 nm and a distance between centerlines of adjacent stripe grids is 40 nm-160 nm.

7. The array substrate of TFT-LCD according to claim 6, wherein the width of each of the stripe grids is 50 nm and the distance between the centerlines of the adjacent stripe grids is 100 nm.

8. A method for manufacturing an array substrate of thin film transistor-liquid crystal display (TFT-LCD), comprising:
    depositing a layer of gate metal film on a substrate, and etching the gate metal film by using a mask process to form a graph comprising gate electrodes and gate lines on the substrate;
    depositing a gate insulating layer, a semiconductor layer and a doped semiconductor layer continuously on the substrate having the graph comprising the gate electrodes and the gate lines, and etching the semiconductor layer and the doped semiconductor layer by using the mask process to form graphs of semiconductor layers and doped semiconductor layers above the gate electrodes; and
    forming graphs of source electrodes, drain electrodes, data lines and pixel electrodes on the substrate having the graphs of semiconductor layers and the doped semiconductor layers, wherein a grid graph is formed on each of the pixel electrodes to make each of the pixel electrodes be simultaneously a built-in polarizer and change natural lights into linear polarized lights, wherein the step of forming graphs of source electrodes, drain electrodes, data lines and pixel electrodes on the substrate comprises:
    depositing a layer of source-drain metal film on the substrate having the graphs of the semiconductor layers and the doped semiconductor layers, etching the source-drain metal film by using the mask process to form graphs of the source electrodes, the drain electrodes and the data lines, and etching and totally removing the doped semiconductor layers between each of the source electrodes and each of the drain electrodes to form each of graphs of TFT channels between each of the source electrodes and each of the drain electrodes;
    depositing a passivation layer on the substrate having the graphs of the source electrodes, the drain electrodes and the data lines, and etching the passivation layer by using the mask process to form a graph of the passivation layer and at the same time form passivation layer via holes corresponding to the positions of the drain electrodes; and
    depositing a layer of metal film on the substrate having the graph of the passivation layer, and etching the metal film by using the mask process to form the pixel electrodes connected to the drain electrodes through the passivation layer via holes and form a grid graph on each of the pixel electrodes to make each of the pixel electrodes be simultaneously a built-in polarizer and change natural lights into linear polarized lights.

9. The method according to claim 8, wherein the step of depositing a layer of metal film on the substrate having the graph of the passivation layer, and etching the metal film by using the mask process to form the pixel electrodes connected to the drain electrodes through the passivation layer via holes and form a grid graph on each of the pixel electrodes to make each of the pixel electrodes be simultaneously a built-in polarizer and change natural lights into linear polarized lights comprises:

depositing a layer of metal film having high electrical conductivity and easy to be etched on the substrate having the graph of the passivation layer, wherein a thickness of the metal film is 150 nm-250 nm;

coating a layer of photo resist on the metal film;

defining a graph of the pixel electrodes by using an optical exposure method, and defining a grid graph on the photo resist corresponding to the graph of each of the pixel electrodes by using a nano-imprint method;

manufacturing the graphs of the pixel electrodes and grid graphs synchronously by using a wet etching method or a dry etching method, wherein the pixel electrodes are connected to the drain electrodes through the passivation layer via holes and a grid graph is formed on each of the pixel electrodes to make each of the pixel electrodes be simultaneously a built-in polarizer and change natural lights into linear polarized lights; and removing residual photo resist by using an ashing process.

10. The method according to claim 8, wherein the step of depositing a layer of metal film on the substrate having the graph of the passivation layer, and etching the metal film by using the mask process to form the pixel electrodes connected to the drain electrodes through the passivation layer via holes and form a grid graph on each of the pixel electrodes to make each of the pixel electrodes be simultaneously a built-in polarizer and change natural lights into linear polarized lights comprises:

depositing a layer of metal film having high electrical conductivity and easy to be etched on the substrate having the graph of the passivation layer, wherein a thickness of the metal film is 150 nm-250 nm;

coating a layer of photo resist on the metal film;

implementing a holographic exposure based on a laser interference principle to define the graphs of the pixel electrodes and the grid graphs, then developing the exposed graphs and drying them to be shaped;

etching the metal film by using a reactive ion etching (RIE) or an inductive couple plasmas (ICP) high density etching to manufacture the graphs of the pixel electrodes and the grid graphs simultaneously, wherein the pixel electrodes are connected to the drain electrodes through the passivation layer via holes, and a grid graph is formed on each of the pixel electrodes to make each of the pixel electrodes be simultaneously a built-in polarizer and change natural lights into linear polarized lights; and removing residual photo resist by using an ashing process.

11. A method for manufacturing an array substrate of thin film transistor-liquid crystal display (TFT-LCD), comprising:

depositing a layer of gate metal film on a substrate, and etching the gate metal film by using a mask process to form a graph comprising gate electrodes and gate lines on the substrate;

depositing a gate insulating layer, a semiconductor layer and a doped semiconductor layer continuously on the substrate having the graph comprising the gate electrodes and the gate lines, and etching the semiconductor layer and the doped semiconductor layer by using the mask process to form graphs of semiconductor layers and doped semiconductor layers above the gate electrodes; and forming graphs of source electrodes, drain electrodes, data lines and pixel electrodes on the substrate having the graphs of semiconductor layers and the doped semiconductor layers, wherein a grid graph is formed on each of the pixel electrodes to make each of the pixel electrodes be simultaneously a built-in polarizer and change natural lights into linear polarized lights, wherein the step of forming graphs of source electrodes, drain electrodes, data lines and pixel electrodes on the substrate comprises:

depositing a layer of metal film on the substrate having the graphs of the semiconductor layers and the doped semiconductor layers, and etching the metal film by using the mask process to form graphs of source electrodes, drain electrodes, data lines and pixel electrodes, wherein a grid graph is formed on each of the pixel electrodes connected to each of the drain electrodes as an integrated structure to make each of the pixel electrodes be simultaneously a built-in polarizer and change natural lights into linear polarized lights; and depositing a passivation layer on the substrate having the graphs of the source electrodes, the drain electrodes, the data lines and the pixel electrodes, and etching the passivation layer by using the mask process to remove the passivation layer on the graph of the pixel electrodes.

12. The method according to claim 11, wherein the step of depositing a layer of metal film on the substrate having the graphs of the semiconductor layers and the doped semiconductor layers, and etching the metal film by using the mask process to form graphs of source electrodes, drain electrodes, data lines and pixel electrodes, wherein a grid graph is formed on each of the pixel electrodes connected to each of the drain electrodes as an integrated structure to make each of the pixel electrodes be simultaneously a built-in polarizer and change natural lights into linear polarized lights comprises:

depositing a layer of metal film having high electrical conductivity and easy to be etched on the substrate having the graphs of the semiconductor layers and the doped semiconductor layers, wherein a thickness of the metal film is 150 nm-250 nm;

coating a layer of photo resist on the metal film;

defining the graphs of the source electrodes, the drain electrodes, the data lines and the pixel electrodes by using an optical exposure method, and defining a grid graph on the photo resist corresponding to the graph of each of the pixel electrodes by using a nano-imprint method;

manufacturing the graphs of the source electrodes, the drain electrodes, the data lines and the pixel electrodes, and the grid graphs synchronously by using a wet etching method or a dry etching method, wherein the doped semiconductor layers between each of the source electrodes and each of the drain electrodes are totally etched and removed so as to form each of graphs of TFT channels between each of the source electrodes and each of the drain electrodes, and a grid graph is formed on each of the pixel electrodes connected to each of the drain electrodes as an integrated structure to make each of the pixel electrodes be simultaneously a built-in polarizer and change natural lights into linear polarized lights; and removing residual photo resist by using an ashing process.

13. The method according to claim 11, wherein the step of depositing a layer of metal film on the substrate having the graphs of the semiconductor layers and the doped semiconductor layers, and etching the metal film by using the mask process to form graphs of source electrodes, drain electrodes, data lines and pixel electrodes, wherein a grid graph is formed on each of the pixel electrodes connected to each of the drain electrodes as an integrated structure to make each of the pixel electrodes be simultaneously a built-in polarizer and change natural lights into linear polarized lights comprises:

depositing a layer of metal film having high electrical conductivity and easy to be etched on the substrate having the graphs of the semiconductor layers and the doped semiconductor layers, wherein a thickness of the metal film is 150 nm-250 nm;

coating a layer of photo resist on the metal film;

implementing a holographic exposure based on a laser interference principle to define the graphs of the source electrodes, the drain electrodes, the data lines and the pixel electrodes, and the grid graphs, developing the exposed graphs and drying them to be shaped;

etching the metal film by using a RIE or an ICP high density etching to manufacture the graphs of the source electrodes, the drain electrodes, the data lines and the pixel electrodes, and the grid graphs simultaneously, wherein the doped semiconductor layers between each of the source electrodes and each of the drain electrodes are totally etched and removed so as to form each of graphs of TFT channels between each of the source electrodes and each of the drain electrodes, and a grid graph is formed on each of the pixel electrodes connected to each of the drain electrodes as an integrated structure to make each of the pixel electrodes be simultaneously a built-in polarizer and change natural lights into linear polarized lights; and removing residual photo resist by using an ashing process.

* * * * *